(12) United States Patent
Kim

(10) Patent No.: US 7,811,894 B2
(45) Date of Patent: Oct. 12, 2010

(54) BIPOLAR JUNCTION TRANSISTOR AND MANUFACTURING METHOD THEREOF

(75) Inventor: Nam Joo Kim, Yongin-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/464,071

(22) Filed: May 11, 2009

(65) Prior Publication Data

US 2009/0221125 A1   Sep. 3, 2009

Related U.S. Application Data

(62) Division of application No. 11/646,828, filed on Dec. 27, 2006, now Pat. No. 7,547,959.

(30) Foreign Application Priority Data

Dec. 30, 2005   (KR) ...................... 10-2005-0134749

(51) Int. Cl.
*H01L 21/331* (2006.01)
*H01L 21/8222* (2006.01)

(52) U.S. Cl. ...................... 438/309; 438/340; 438/350; 257/197; 257/592

(58) Field of Classification Search ................ 438/309, 438/340, 350, 356; 257/197, 592, E51.004, 257/E31.069, E27.017
See application file for complete search history.

(56) References Cited

U.S. PATENT DOCUMENTS

| 5,557,131 | A | 9/1996 | Lee |
| 7,071,500 | B2 * | 7/2006 | Miura et al. ................. 257/197 |
| 7,358,545 | B2 * | 4/2008 | Tsai ........................... 257/197 |
| 2008/0087918 | A1 | 4/2008 | Arendt |

* cited by examiner

*Primary Examiner*—Theresa T Doan
(74) *Attorney, Agent, or Firm*—The Law Offices of Andrew D. Fortney; Andrew D. Fortney

(57) ABSTRACT

An improved bipolar junction transistor and a method for manufacturing the same are provided. The bipolar junction transistor includes: a buried layer and a high concentration N-type collector region in a P-type semiconductor substrate; a low concentration P-type base region in the semiconductor substrate above the buried layer; a first high concentration P-type base region along an edge of the low concentration P-type base region; a second high concentration P-type base region at a center of the low concentration P-type base region; a high concentration N-type emitter region between the first and second high concentration base regions; and insulating layer spacers between the high concentration base regions and the high concentration emitter regions. In the bipolar junction transistor, the emitter-base distance can be reduced using a trench and an insulating layer spacer. This may improve base voltage and high-speed response characteristics.

14 Claims, 4 Drawing Sheets

BIPOLAR JUNCTION TRANSISTOR AND MANUFACTURING METHOD THEREOF

RELATED APPLICATIONS

This application is a divisional of U.S. patent application Ser. No. 11/646,828, filed on Dec. 27, 2006 now U.S. Pat. No. 7,547,959, which is incorporated herein by reference in its entirety.

BACKGROUND OF THE INVENTION

1. Field of the Invention

The present invention relates to a manufacturing technology of a semiconductor device, and more particularly to a bipolar junction transistor capable of reducing an interval between an emitter and a base using a trench process and an insulating layer spacer and a method for manufacturing the same.

2. Description of the Related Art

In general, in a bipolar junction transistor (BJT), electrons and holes function as a current carrier. Because such a bipolar junction transistor has high response speed, it has been widely as high speed and high frequency devices.

FIG. 1a and FIG. 1b are views showing a construction of a bipolar junction transistor according to the related art.

FIG. 1a is a plan view, and FIG. 1b is a cross-sectional view of the bipolar junction transistor taken along line A-A.

FIG. 1a and FIG. 1b, a high concentration N-type collector region 11 including a buried layer 11a is formed in a semiconductor substrate 10, and a selective ion implantation process is performed to form a low concentration P-type base region 12, which is an intrinsic base.

The selective ion implantation process for the high concentration base region is again performed to form a high concentration P-type base region 13 being an extrinsic base, and form a high concentration N-type emitter region 14 beside the high concentration P-type base region 13.

In the bipolar junction transistor, in order to form an emitter region 14 and a base region 13 by an ion implantation, a photolithography process is required. Accordingly, the emitter region 14 and the base region 13 need to maintain a predetermined distance in consideration of misalign in the photolithography process. When the emitter region 14 and the base region are spaced apart from each other greater than a predetermined distance, the extrinsic base 13 is far from an intrinsic base 12, which is positioned at a lower end of an emitter 14.

In this case, a base voltage of the bipolar junction transistor drops to reduce a response speed of the bipolar junction transistor.

SUMMARY OF THE INVENTION

Accordingly, the present invention is directed to a bipolar junction transistor that substantially obviates one or more problems due to limitations and disadvantages of the related art.

An object of the present invention is to provide a bipolar junction transistor, which may reduce an interval between an emitter and a base.

Another object of the present invention is to provide a bipolar junction transistor, which enhances a base voltage characteristic and a high-speed response characteristic.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a bipolar junction transistor and a method for manufacturing the same having a following arrangement.

There is provided a bipolar junction transistor comprising: a buried layer and a high concentration N-type collector region formed in a P-type semiconductor substrate; a low concentration P-type base region formed in the semiconductor substrate above the buried layer; a first high concentration P-type base region formed along an edge of the low concentration P-type base region; a second high concentration P-type base region formed at a center of the low concentration P-type base region; a high concentration N-type emitter region formed between the first and second high concentration base regions; and insulating layer spacers between the high concentration base regions and the high concentration emitter regions.

In the bipolar junction transistor of the present invention, the first and second high concentration base regions and the high N-type emitter region are formed of a doped polysilicon.

In another aspect of the present invention, there is provided method for manufacturing a bipolar junction transistor comprising: forming a high concentration N-type collector region including a buried layer in a P-type semiconductor substrate; forming a low concentration P-type base region in the semiconductor substrate above the buried layer; etching the semiconductor substrate in the low concentration base region to form a trench; depositing a first polysilicon layer doped with a high concentration P-type impurity at an entire surface of the semiconductor substrate, and depositing a first insulating layer on the first polysilicon layer; anisotropically etching the first insulating layer to form a first insulating layer spacer, and anisotropically etching the first polysilicon layer to form a first high concentration P-type base region; depositing and anisotropically etching an entire surface of a second insulating layer to form a second insulating layer spacer; depositing and anisotropically etching an entire surface of a second polysilicon layer doped with a high concentration N-type impurity to form a high concentration N-type emitter region; depositing and anisotropically etching an entire surface of a third insulating layer to form a third insulating layer spacer; and depositing and anisotropically etching a third insulating layer doped with a high concentration P-type impurity to form a second concentration P-type base region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
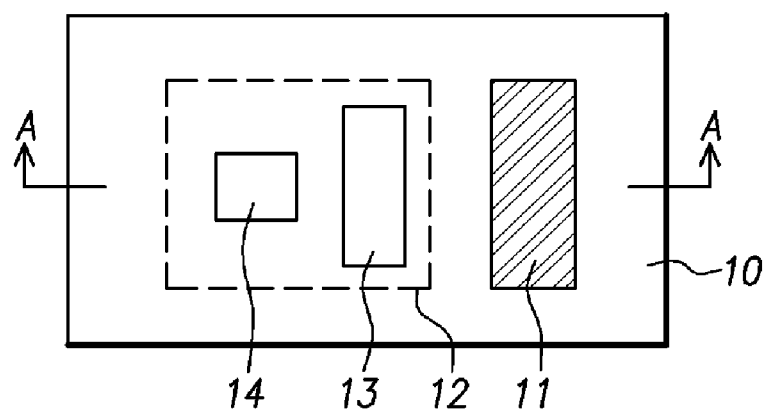
FIGS. 1a and 1b are a plan view and a cross-sectional view showing a construction of a bipolar junction transistor according to the related art.
Figure 1B:
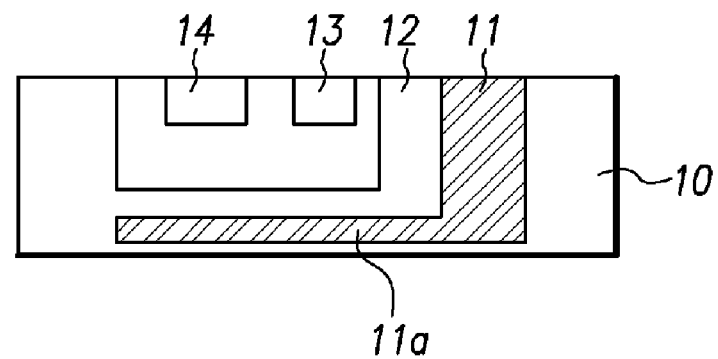
Figure 2A:
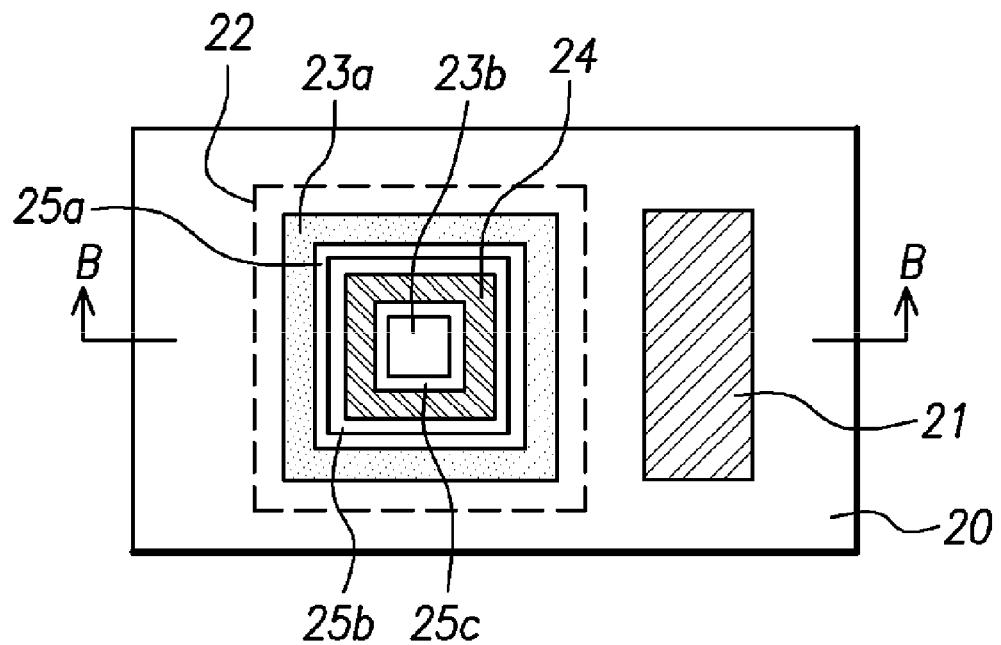
FIGS. 2a and 2b are a plan view and a cross-sectional view showing a construction of a bipolar junction transistor according to an embodiment of the present invention.

FIG. 2a is a plan view showing a construction of a bipolar junction transistor manufactured by the embodiment of the present invention.

Figure 2B:
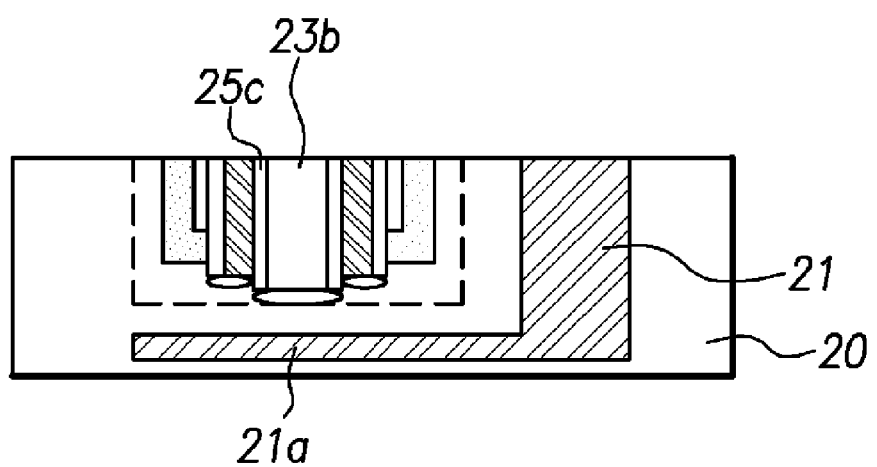

Referring to FIGS. 2a and 2b, a high concentration N-type collector region 21 including a high concentration N-type buried layer 21a is formed in a P-type semiconductor substrate 20. A low concentration P-type base region 22 being an intrinsic base is formed in the semiconductor substrate 20 above the buried layer 21a.

Two P-type base regions 23a and 23b being the extrinsic base are formed in the low concentration base region 22. A first high concentration base region 23a is formed along an edge of the low concentration base region 22, the second high concentration base region 23b is formed at a center of the low concentration base region 22. An N-type emitter region 24 is formed between the first and second high concentration base regions 23a and 23b.

One or two insulating layer spacers 25a, 15b, and 25c are formed between the high concentration base regions 23a and 23b, and the high concentration emitter region 24 adjacent to each other.

Such a structure may reduce an interval between the emitter 24 and bases 23a and 23b to the utmost, and improve a base voltage characteristic and a high-speed response characteristic.

The following is a method for manufacturing the bipolar junction transistor. A construction of the bipolar junction transistor will be apparent from a following explanation of a manufacturing method thereof.

Figure 3A:
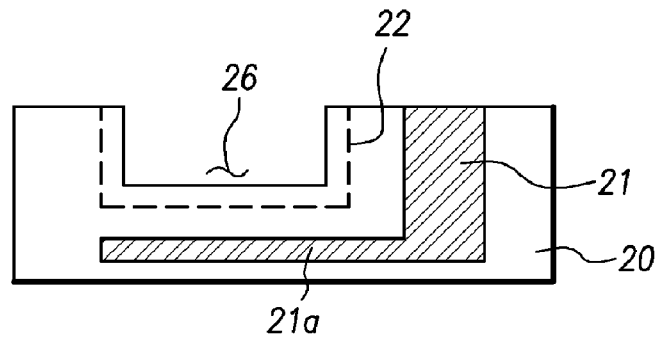
FIGS. 3a through 3e are cross-sectional views of a bipolar junction transistor for describing a method for manufacturing a bipolar junction transistor according to the embodiment of the present invention.

First, referring to FIG. 3a, an N-type high concentration collector region 21 including a high concentration n+ buried layer 21a is formed in a P-type semiconductor substrate 20.

Next, a P-type low concentration base region 22 being an intrinsic base is formed in the semiconductor substrate 20 above the buried layer 21a.

Further, the semiconductor substrate 20 in the low concentration P-type base region 22 is etched to form a trench 26. For the reference, the trench 26 is region to form an extrinsic base with an emitter in a subsequent process.

Figure 3B:
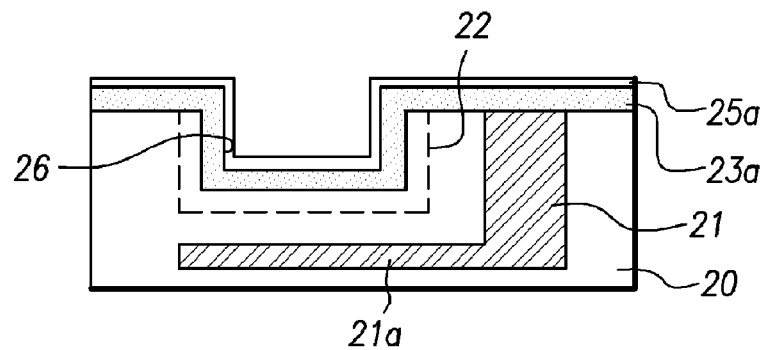

Then, as shown in FIG. 3b, an entire surface of a first polysilicon layer 23a is deposited on a semiconductor substrate 20 in which the trench 26 is formed, and a first insulating layer 25a is again deposited thereon. The first polysilicon layer 23a is a layer doped with high concentration P-type impurities.

Figure 3C:
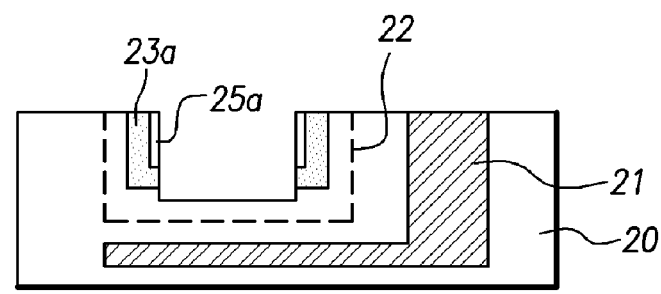

Subsequently, as shown in FIG. 3C, after the first insulating layer 25a is anisotropically etched, the first polysilicon layer 23a is also anisotropically etched.

As a result, the first polysilicon layer 23a remains at a sidewall of a trench in a form of a spacer to form the first high concentration P-type base region.

Moreover, the first insulating layer 25a remains at a sidewall of the first high concentration base region 23a to form a first insulating layer spacer.

Figure 3D:
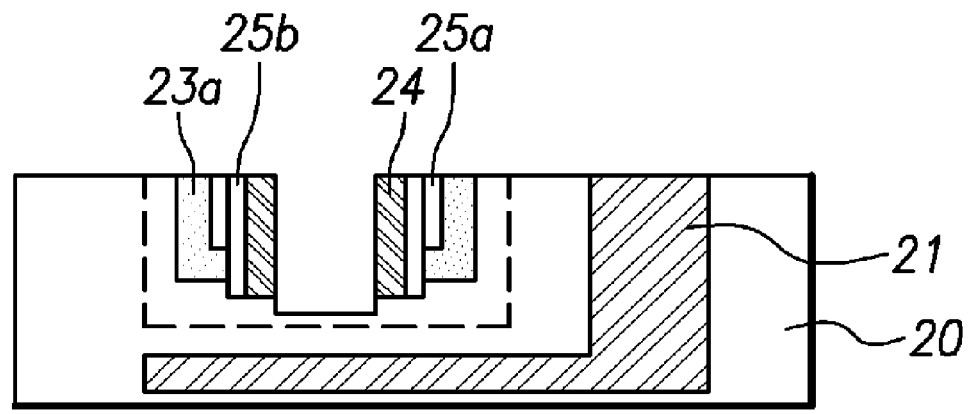

Next, with reference to FIG. 3d, an entire surface of the second insulating layer is deposited and anisotropically etched to form a second insulating layer spacer 25b.

Then, an entire surface of the second polysilicon layer doped with high concentration N-type impurities is deposited and anisotropically etched to form high concentration N-type emitter region 24.

Figure 3E:
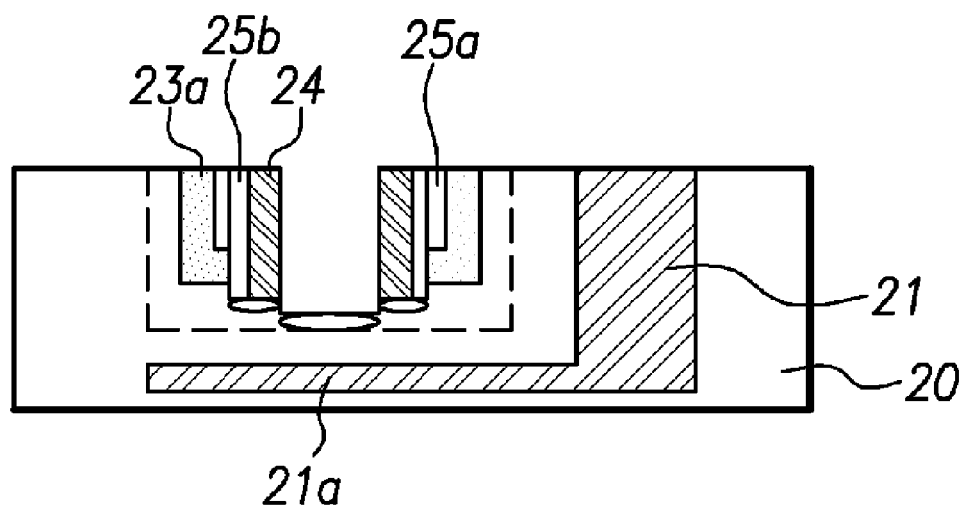

Subsequently, referring to FIG. 3e, an entire surface of a third insulating layer is deposited and anisotropically etched to form a third insulating layer spacer 23c. Then, an entire surface of the third polysilicon layer doped with high concentration P-type impurities is etched and anisotropically etched to form high concentration P-type base region 23b.

As is seen from the forgoing description, in an NPN bipolar junction transistor, a distance between an emitter and a base can be near embodied to the utmost using a trench process and an insulating layer spacer. This may improve a base voltage characteristic and a high-speed response characteristic.

Although the present invention has described an NPN bipolar junction transistor and a method for manufacturing the same, a PNP bipolar junction transistor and a manufacturing method thereof can be embodied by the same manner as another embodiment.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a bipolar junction transistor comprising:
    forming a collector region having a first conductivity type in a semiconductor substrate having a second conductivity type;
    forming a low concentration base region having the second conductivity type in the semiconductor substrate adjacent to the collector region;
    etching the semiconductor substrate in the low concentration base region to form a trench;
    depositing a first doped polysilicon layer on an entire surface of the semiconductor substrate, and depositing a first insulating layer on the first doped polysilicon layer;
    etching the first insulating layer to form a first insulating spacer and etching the first doped polysilicon layer to form a first base region having the second conductivity type;
    forming a second insulating layer spacer on the first base region;
    forming an emitter region having the first conductivity type on the second insulating spacer and an exposed bottom surface of trench;
    forming a third insulating spacer on a sidewall of the emitter region; and
    forming a second base region having the second conductivity type between opposed portions of the third insulating spacer.

2. The method of claim 1, wherein forming the collector region comprises forming a buried layer in the semiconductor substrate.

3. The method of claim 2, wherein the buried layer comprises a buried implant layer.

4. The method of claim 2, wherein forming the high concentration N-type collector region further comprises forming a plug in electrical contact with the buried layer, adjacent to the low concentration base region in a horizontal direction.

5. The method of claim 2, wherein the plug comprises an implant plug.

6. The method of claim 2, wherein the low concentration P-type base region is in the semiconductor substrate above the buried layer.

7. The method of claim 1, wherein the first doped polysilicon layer includes a high concentration of a P-type impurity.

8. The method of claim 1, wherein etching the first insulating layer comprises anisotropic etching.

9. The method of claim 1, wherein etching the first polysilicon layer comprises anisotropic etching.

10. The method of claim 1, wherein forming the second insulating layer spacer comprises depositing a second insulating layer on an entire surface of the substrate, including the trench, and anisotropically etching the second insulating layer.

11. The method of claim 1, wherein forming the emitter region comprises depositing a high concentration N-type silicon layer on the first insulating spacer and anisotropically etching the high concentration N-type silicon layer.

12. The method of claim 1, wherein forming the third insulating spacer comprises depositing a third insulating layer on an entire surface of substrate, including the emitter region, and anisotropically etching the third insulating layer.

13. The method of claim 1, wherein forming the second base region comprises depositing a third polysilicon layer doped with a high concentration of impurity on an entire surface of the substrate, including between opposed third insulating spacer(s), and anisotropically etching the third polysilicon layer.

14. The method of claim 1, wherein the second conductivity type is a P-type, and the first conductivity type is an N-type.

* * * * *